US012812974B2

(12) United States Patent
Yang et al.

(10) Patent No.: US 12,812,974 B2
(45) Date of Patent: Nov. 24, 2026

(54) ARRAY SUBSTRATE AND DISPLAY PANEL

(71) Applicants: Chongqing BOE Optoelectronics Technology Co., Ltd., Chongqing (CN); BOE Technology Group Co., Ltd., Beijing (CN)

(72) Inventors: Guodong Yang, Beijing (CN); Xiaoyuan Wang, Beijing (CN); Hui Guo, Beijing (CN); Chen Xu, Beijing (CN); Bin Wan, Beijing (CN); Junming Chen, Beijing (CN); Yan Liu, Beijing (CN); Xun Pu, Beijing (CN); Yuanyuan Zhu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 362 days.

(21) Appl. No.: 18/292,969

(22) PCT Filed: Sep. 26, 2022

(86) PCT No.: PCT/CN2022/121445

§ 371 (c)(1),
(2) Date: Jan. 29, 2024

(87) PCT Pub. No.: WO2024/065106

PCT Pub. Date: Apr. 4, 2024

(65) Prior Publication Data

US 2025/0098299 A1 Mar. 20, 2025

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
None
See application file for complete search history.

(56) References Cited

U.S. PATENT DOCUMENTS

2014/0078124 A1* 3/2014 Chen .................... G09G 3/3696 345/205
2016/0117042 A1 4/2016 Ito et al.
(Continued)

FOREIGN PATENT DOCUMENTS

CN 104934445 A * 9/2015
CN 107464830 A 12/2017
(Continued)

*Primary Examiner* — Cory W Eskridge
(74) *Attorney, Agent, or Firm* — XSENSUS LLP

(57) ABSTRACT

Provided is an array substrate. The array substrate includes a substrate, comprising a display region and a peripheral region surrounding the display region, the peripheral region at least including a gate-driver-on-array (GOA) region extending in a first direction; a plurality of thin film transistors, the plurality of thin film transistors being disposed at least in the GOA region; and a plurality of first patterns, wherein the plurality of first patterns are disposed at least on one side of the GOA region, the plurality of first patterns are spaced apart from the GOA region in the first direction, and a plurality of first patterns disposed on a same side of the GOA region are arranged in an array.

19 Claims, 9 Drawing Sheets

(56) References Cited

U.S. PATENT DOCUMENTS

| | | | | |
|---|---|---|---|---|
| 2016/0293091 | A1* | 10/2016 | Wang | G09G 3/2092 |
| 2017/0154904 | A1 | 6/2017 | Liu | |
| 2018/0069031 | A1 | 3/2018 | Wu et al. | |
| 2019/0221626 | A1 | 7/2019 | Li | |
| 2022/0399431 | A1* | 12/2022 | Kim | H10D 86/00 |
| 2024/0257730 | A1* | 8/2024 | Liu | H10K 59/1201 |

FOREIGN PATENT DOCUMENTS

| | | | | | |
|---|---|---|---|---|---|
| CN | 108646474 | A | | 10/2018 | |
| CN | 107808935 | B | | 4/2020 | |
| CN | 111129040 | A | | 5/2020 | |
| CN | 112925136 | A | * | 6/2021 | G09G 3/3266 |
| CN | 112951854 | A | * | 6/2021 | H10D 86/481 |
| CN | 114171536 | A | | 3/2022 | |
| CN | 114242736 | A | | 3/2022 | |
| CN | 113867053 | B | * | 5/2023 | G03F 1/32 |
| JP | 2008-020772 | A | | 1/2008 | |

* cited by examiner

ARRAY SUBSTRATE AND DISPLAY PANEL

CROSS-REFERENCE TO RELATED APPLICATION

This application is a U.S. national stage of international application No. PCT/CN2022/121445, filed on Sep. 26, 2022, and the disclosure of which is herein incorporated by reference in its entirety.

TECHNICAL FIELD

The present disclosure relates to the field of display technologies, and in particular relates to an array substrate and a display panel.

BACKGROUND OF THE INVENTION

Thin film transistors (TFTs) have the advantages of fewer process steps, higher mobility, better bending performance, lower process temperature and the like, and are widely used in flexible display panels.

SUMMARY OF THE INVENTION

The present disclosure provides an array substrate. The technical solutions are as follows.

In some embodiments, the present disclosure provides an array substrate. The array substrate includes:

a substrate, including a display region and a peripheral region surrounding the display region, wherein the peripheral region at least includes a gate-driver-on-array (GOA) region extending in a first direction;

a plurality of thin film transistors disposed in the GOA region; and a plurality of first patterns, wherein the plurality of first patterns are disposed at least on one side of the GOA region, the plurality of first patterns are spaced apart from the GOA region in the first direction, and a plurality of first patterns disposed on a same side of the GOA region are arranged in an array;

wherein the thin film transistor includes a gate, a gate insulating layer, an active layer and a source/drain electrode layer which are sequentially laminated in a direction going away from the substrate, wherein the source/drain electrode layer includes a source and a drain spaced apart from each other; and the plurality of first patterns are disposed in a same layer as at least one of the source and the drain.

In some embodiments, a shape of an orthographic projection of the first pattern on the substrate is a rectangle.

In some embodiments, the shape of the orthographic projection of the first pattern on the substrate is a square.

In some embodiments, one of two vertical boundaries of the first pattern is parallel to the first direction, and the other one of the two boundaries is parallel to a second direction; wherein the second direction is parallel to an arrangement direction of the display region and the GOA region, and the first direction intersects the second direction.

In some embodiments, a length of the first pattern along the first direction is m1, and a distance between any two adjacent first patterns along the first direction is n1, wherein m1/n1 ranges from 0.9 to 1.9; and a length of the first pattern along the second direction is m2, and a distance between any two adjacent first patterns along the second direction is n2, wherein m2/n2 ranges from 0.9 to 1.9.

In some embodiments, a minimum distance between orthographic projections of the plurality of first patterns on the substrate and orthographic projections of other structures in the array substrate on the substrate ranges from 15 μm to 30 μm.

In some embodiments, the peripheral region includes two GOA regions extending along the first direction, and the two GOA regions are respectively located on two sides of the display region;

wherein the plurality of first patterns are disposed on two sides of each of the two GOA regions.

In some embodiments, the peripheral region further includes a fan-out region extending along a second direction, and the second direction is parallel to an arrangement direction of the GOA region and the display region. The array substrate further includes:

a plurality of second patterns, wherein the plurality of second patterns are disposed at least on one side of the fan-out region, the plurality of second patterns are spaced apart from the fan-out region along the second direction, a plurality of second patterns disposed on a same side of the fan-out region are arranged in an array, and the second pattern is different from the first pattern in at least one of the shape and size;

wherein the plurality of second patterns include a plurality of first type of second patterns and a plurality of second type of second patterns, wherein the plurality of first type of second patterns are disposed in a same layer as the gate, and the plurality of second type of second patterns are disposed in a same layer as the source and the drain.

In some embodiments, orthographic projections of the plurality of first type of second patterns on the substrate are not overlapped with orthographic projections of the plurality of second type of second patterns on the substrate.

In some embodiments, the orthographic projections of the plurality of first type of second patterns on the substrate and the orthographic projections of the plurality of second type of second patterns on the substrate are alternately arranged along the second direction.

In some embodiments, a number of the plurality of first type of second patterns is equal to a number of the plurality of second type of second patterns, and the plurality of first type of second patterns are in one-to-one correspondence with the plurality of second type of second patterns; and an orthographic projection of each of the first type of second patterns on the substrate is overlapped with an orthographic projection of one corresponding second type of second pattern on the substrate.

In some embodiments, a shape of an orthographic projection of the second pattern on the substrate is a rectangle, and a length of the second pattern along the first direction is greater than a length of the second pattern along the second direction.

In some embodiments, one of two vertical boundaries of the second pattern is parallel to the first direction, and the other one of the two vertical boundary is parallel to the second direction.

In some embodiments, the length of the second pattern along the first direction is r1, and a distance between any two adjacent second patterns along the first direction is s1, wherein r1/s1 ranges from 0.9 to 1.9; and the length of the second pattern along the second direction is r2, and a distance between any two adjacent second patterns along the second direction is s2, wherein r2/s2 ranges from 0.9 to 1.9.

In some embodiments, a minimum distance between orthographic projections of the second patterns on the substrate and orthographic projections of other structures in the array substrate on the substrate ranges from 75 μm to 100 μm.

In some embodiments, the plurality of second patterns are disposed on two sides of the fan-out region.

In some embodiments, the plurality of thin film transistors disposed in the GOA region constitute a plurality of cascaded shift register units, wherein each of the shift register units includes eighteen thin film transistors and one storage capacitor.

In some embodiments, an active layer of the thin film transistor made of a metal oxide material.

In some embodiments, the present disclosure provides a display panel. The display panel includes a plurality of light-emitting units and the array substrate described in the above aspect.

The plurality of light-emitting units are disposed in a display region of the array substrate.

BRIEF DESCRIPTION OF DRAWINGS

To describe the technical solutions in the embodiments of the present disclosure more clearly, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort. The present disclosure is illustrated by taking an oxide thin film transistor as an example.

DETAILED DESCRIPTION OF THE INVENTION

To make the objects, technical solutions, and advantages of the present disclosure clearer, the embodiments of the present disclosure are further described in detail hereinafter with reference to the accompanying drawings.

In the related art, a thin film transistor includes a gate, a gate insulating layer, an active layer and a source/drain electrode layer which are sequentially laminated in a direction going away from the substrate. The source/drain electrode layer includes a source and a drain which are spaced apart from each other.

However, since the active layer is easily rendered conductive in the manufacturing process of the thin film transistor, the characteristics of the thin film transistor become abnormal easily, resulting in a low yield of the array substrate and a poor display effect of the display panel.

The process steps of oxide thin film transistors are much fewer than that of low temperature polysilicon thin film transistors, and the mobility of the oxide thin film transistors is much higher than that of amorphous silicon thin film transistors. The oxide thin film transistors also have good bending performance and low process temperature, and can be used to manufacture flexible substrates. Therefore, the oxide thin film transistors have a good development prospect in flexible display in the future.

However, compared with the amorphous silicon thin film transistors, the oxide thin film transistors are easily rendered conductive in the preparation process of the array substrate, which makes the characteristics of the oxide thin film transistors become abnormal, resulting in abnormal display of the display panel. This greatly affects the yield of the oxide display panels and the low cost advantages. The oxide display panel means that the thin film transistor in the display panel is an oxide thin film transistor.

Figure 1:
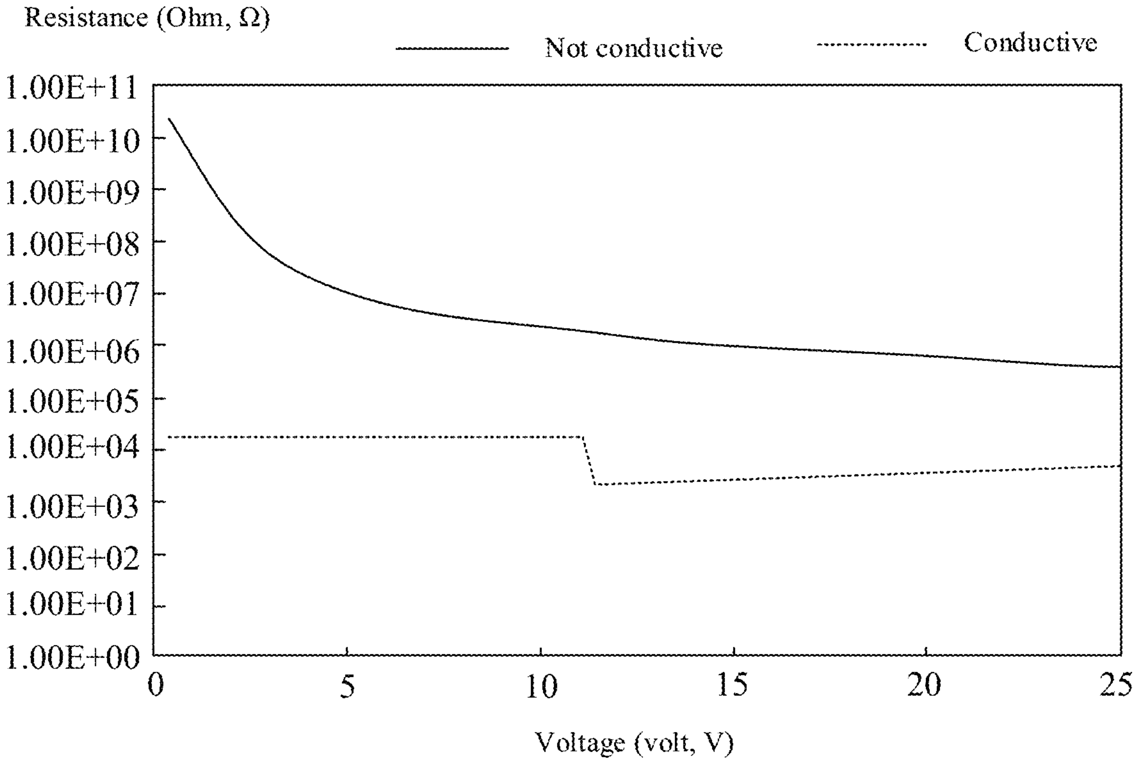
FIG. 1 is a graph showing a relationship between the resistance and voltage of a thin film transistor before and after an active layer of the thin film transistor is rendered conductive according to some embodiments of the present disclosure.
Figure 2:
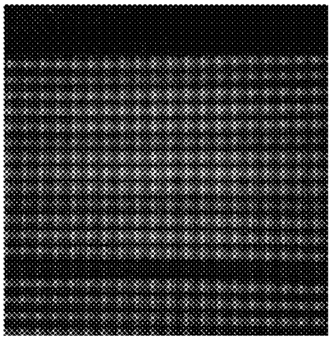
FIG. 2 is a schematic diagram of a display effect after an active layer of a thin film transistor in an array substrate is rendered conductive according to some embodiments of the present disclosure.

It is found through testing that in the oxide display panel, the active layer of the thin film transistor in the gate-driver-on-array (GOA) region is easily rendered conductive due to a large blank region on a side of the GOA region. Referring to FIG. 1, before the active layer of a thin film transistor is rendered conductive, the resistance is $10^{10}\Omega$ (ohm). As the voltage increases, the resistance decreases gradually until the thin film transistor is turned on. However, after the active layer of the thin film transistor is rendered conductive, the resistance is $10^{4}\Omega$, and the resistance does not change with the increase of the voltage, thereby causing the thin film transistor to fail. Thus, with reference to FIG. 2, the display effect of the display panel is poor, and striped patterns (weak dark lines occur every four rows) occur.

In FIG. 1, 1.00E+01 represents $10^1$, 1.00E+02 represents $10^2$, 1.00E+3 represents $10^3$, and so on, and details are not described herein again.

Figure 3:
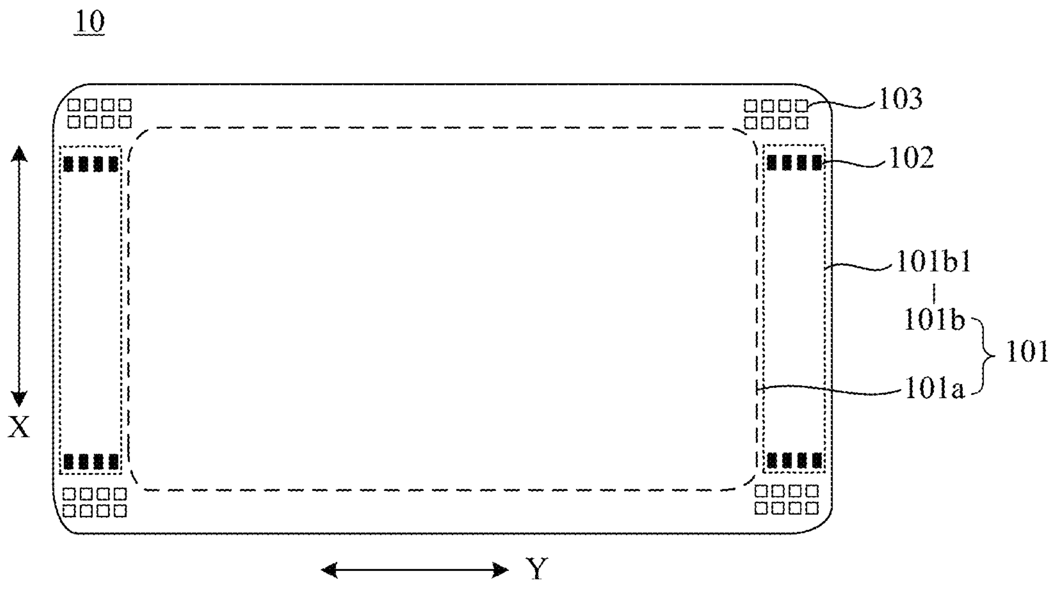
FIG. 3 is a schematic structural diagram of an array substrate according to some embodiments of the present disclosure.

FIG. 3 is a schematic structural diagram of an array substrate according to some embodiments of the present disclosure. As shown in FIG. 3, the array substrate 10 includes a substrate 101, a plurality of thin film transistors 102, and a plurality of first patterns 103.

Figure 4:
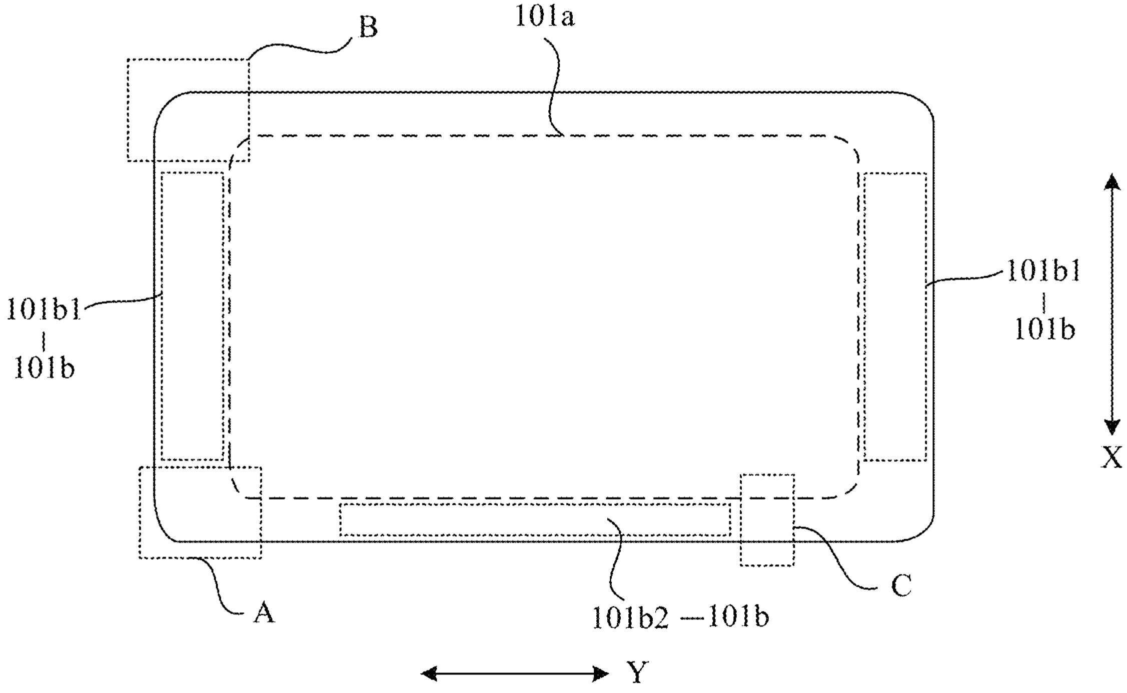
FIG. 4 is a top view of a substrate according to some embodiments of the present disclosure.

FIG. 4 is a top view of a substrate according to some embodiments of the present disclosure. Referring to FIG. 3 and FIG. 4, the substrate 101 further includes a display region 101*a* and a peripheral region 101*b* surrounding the display region 101*a*. The peripheral region 101*b* at least includes a GOA region 101*b*1 extending along a first direction X. The thin film transistors 102 are at least disposed in the GOA region 101*b*1. Certainly, the thin film transistors 102 may also be disposed in the display region 101*a*.

The thin film transistors 102 disposed in the GOA region 101*b*1 constitute a gate driver on array (GOA) circuit of the array substrate 10. The thin film transistors 102 disposed in the display region 101*a* constitute a drive circuit for driving a light emitting unit to emit light in the array substrate 10.

Figure 5:
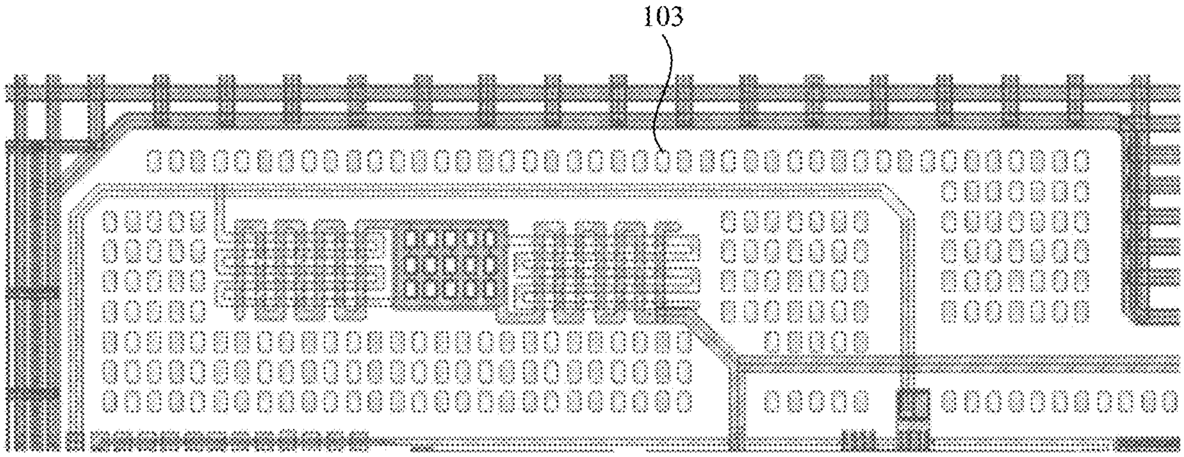
FIG. 5 is a partial schematic diagram of an array substrate in region A of FIG. 4 according to some embodiments of the present disclosure.

FIG. 5 is a partial schematic diagram of an array substrate in the region A of FIG. 4 according to some embodiments of the present disclosure. Referring to FIG. 4 and FIG. 5, the plurality of first patterns 103 are at least disposed on one side of the GOA region 101*b*1, the plurality of first patterns 103 are spaced apart from the GOA region 101*b*1 along the first direction X, and the plurality of first patterns 103 disposed on the same side of the GOA region 101*b*1 are arranged in an array.

Figure 6:
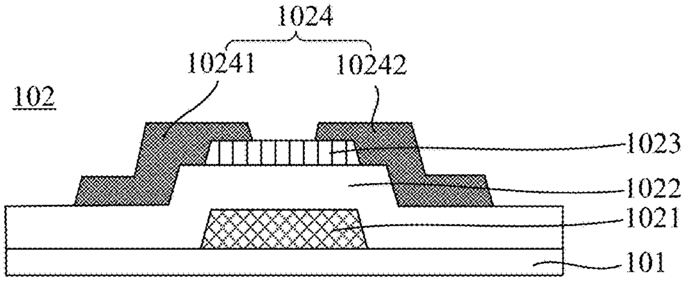
FIG. 6 is a schematic structural diagram of a thin film transistor according to some embodiments of the present disclosure.

FIG. 6 is a schematic structural diagram of a thin film transistor according to some embodiments of the present disclosure. Referring to FIG. 6, the thin film transistor 102 includes a gate 1021, a gate insulating layer 1022, an active layer 1023 and a source/drain electrode layer 1024 which are sequentially laminated in a direction going away from the substrate 101. The source/drain electrode layer 1024 includes a source 10241 and a drain 10242 spaced from each other. The plurality of first patterns 103 in the array substrate 10 are disposed in the same layer as at least one of the source 10241 and the drain 10242 of the thin film transistor 102. Here, the plurality of first patterns 103 being disposed in the same layer as at least one of the source 10241 and the drain 10242 means that the plurality of first patterns 103 are made of the same material as at least one of the source 10241 and the drain 10242 by the same patterning process. Generally, the source 10241 and the drain 10242 are made of the same material by the same patterning process.

In the array substrate 10, there is usually a large blank region (that is, a region without wiring and thin film transistors being provided) one side of the GOA region 101*b*1. By providing a plurality of first patterns 103 in the blank region on the side of the GOA region 101*b*1, the consumption amount of the etching solution can be reduced when the source/drain electrode film layer is etched to form the source 10241 and the drain 10242 of the thin film transistor 102, thereby preventing a large amount of etching solution from being consumed due to the large area of etching. Therefore, it is ensured that there is enough etching solution for etching to form the GOA region 101*b*1 and the source 10241 and the drain 10242 of the thin film transistor 102 in the display region 101*a*, thereby avoiding the residual material of the source/drain electrode film layer caused by less etching solution in the GOA region 101*b*1 and the display region 101*a*, and preventing the channel of the thin film transistor 102 from being conducted due to the residual material of the source/drain electrode film layer on the active layer 1023. In this way, the active layer 1023 of the thin film transistor 102 is prevented from being rendered conductive, thereby ensuring the characteristics of the thin film transistor 102, and improving the yield of the array substrate 10 and the display effect of the display panel.

In addition, by providing a plurality of first patterns 103 on one side of the GOA region 101*b*1, the pattern of the source/drain electrode film layer on the side of the GOA region 101*b*1 and the pattern of the source/drain electrode film layer on the active layer in the display region have better uniformity.

In summary, the embodiments of the present disclosure provide an array substrate. A plurality of first patterns are provided on one side of the GOA region of the array substrate, which ensures that there is enough etching solution for etching to form the GOA region and the source and the drain of the thin film transistor in the display region, thereby avoiding the residual material of the source/drain electrode film layer caused by less etching solution in the GOA region and the display region, and preventing the channel of the thin film transistor from being conducted due to the residual material of the source/drain electrode film layer on the active layer. In this way, the active layer of the thin film transistor is prevented from being rendered conductive, thereby ensuring the characteristics of the thin film transistor, and improving the yield of the array substrate and the display effect of the display panel.

In the related art, in order to avoid electrostatic influence, an electrostatic discharge (ESD) unit is provided on one side of the GOA region 101*b*1. In the present disclosure, the ESD unit in this region is removed, and a plurality of first patterns 103 are provided instead. The ESD unit is provided in the peripheral region 101*b* on the upper side of the display region 101*a* (in the peripheral region 101*b* on the side, away from the fan-out region 101*b*2, of the display region 101a). For example, on the premise of not increasing the cost and process difficulty of the mask, the ESD unit is removed so as to adjust the mask.

In the embodiments of the present disclosure, the active layer of the thin film transistor 102 is made of a metal oxide material. That is, the thin film transistor 102 is an oxide thin film transistor.

In the embodiments of the present disclosure, the source/drain electrode film layer includes a first film layer, a second film layer, and a third film layer that are sequentially laminated. The first film layer and the third film layer are made of molybdenum niobium alloy (MoNb), and the second film layer is made of copper (Cu). That is, the source/drain electrode film layer is a laminated structure of MoNb/Cu/MoNb.

In some embodiments, the shape of the orthographic projection of the first pattern 103 on the substrate 101 is a rectangle. The rectangle is a right-angled rectangle, a chamfered rectangle or a rounded rectangle. For example, the shape of the orthographic projection of the first pattern 103 on the substrate 101 is square. That is, the orthographic projection of the first pattern 103 on the substrate 101 at least includes two vertical boundaries with the same length.

As can be seen from FIG. 5, one of the two vertical boundaries of the first pattern 103 is parallel to the first direction X, and the other boundary is parallel to the second direction Y. The second direction Y is parallel to the arrangement direction of the display region 101*a* and the GOA region 101*b*1. The first direction X intersects the second direction Y. For example, the first direction X is perpendicular to the second direction Y. The plurality of first patterns 103 are arranged in an array in the first direction X and the second direction Y.

Figure 7:
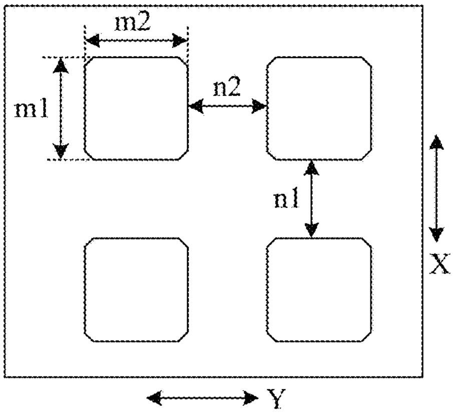
FIG. 7 is a top view of a first pattern according to some embodiments of the present disclosure.

In some embodiments, referring to FIG. 7, the length of the first pattern 103 along the first direction X is m1, the distance between any two adjacent first patterns 103 along the first direction X is n1, and m1/n1 ranges from 0.9 to 1.9. The length of the first pattern 103 along the second direction Y is m2, the distance between any two adjacent first patterns 103 along the second direction Y is n2, and m2/n2 ranges from 0.9 to 1.9.

For example, the length m1 of the first pattern 103 along the first direction X and the length m2 of the second pattern 103 along the second direction Y both range from 12 μm to 15 μm. The distance n1 between any two adjacent first patterns 103 along the first direction X and the distance n2 between any two adjacent first patterns 103 along the second direction Y both range from 8 μm to 13 μm. Referring to FIG. 7, the shape of the orthographic projection of the first pattern 103 on the substrate 101 has four chamfers on the basis of the rectangle, that is, the shape of the orthographic projection of the first pattern 103 on the substrate 101 is a chamfered rectangle.

In some embodiments, the minimum distance between the orthographic projections of the plurality of first patterns 103 on the substrate 101 and the orthographic projections of other structures in the array substrate 10 on the substrate 101 ranges from 15 μm to 30 μm. That is, the distance between the plurality of first patterns 103 and other structures in the array substrate 10 is long, which prevents the plurality of first patterns 103 from affecting other structures in the array substrate 10. The other structures are wires for transmitting signals in the array substrate 10, or thin film transistors.

Figure 8:
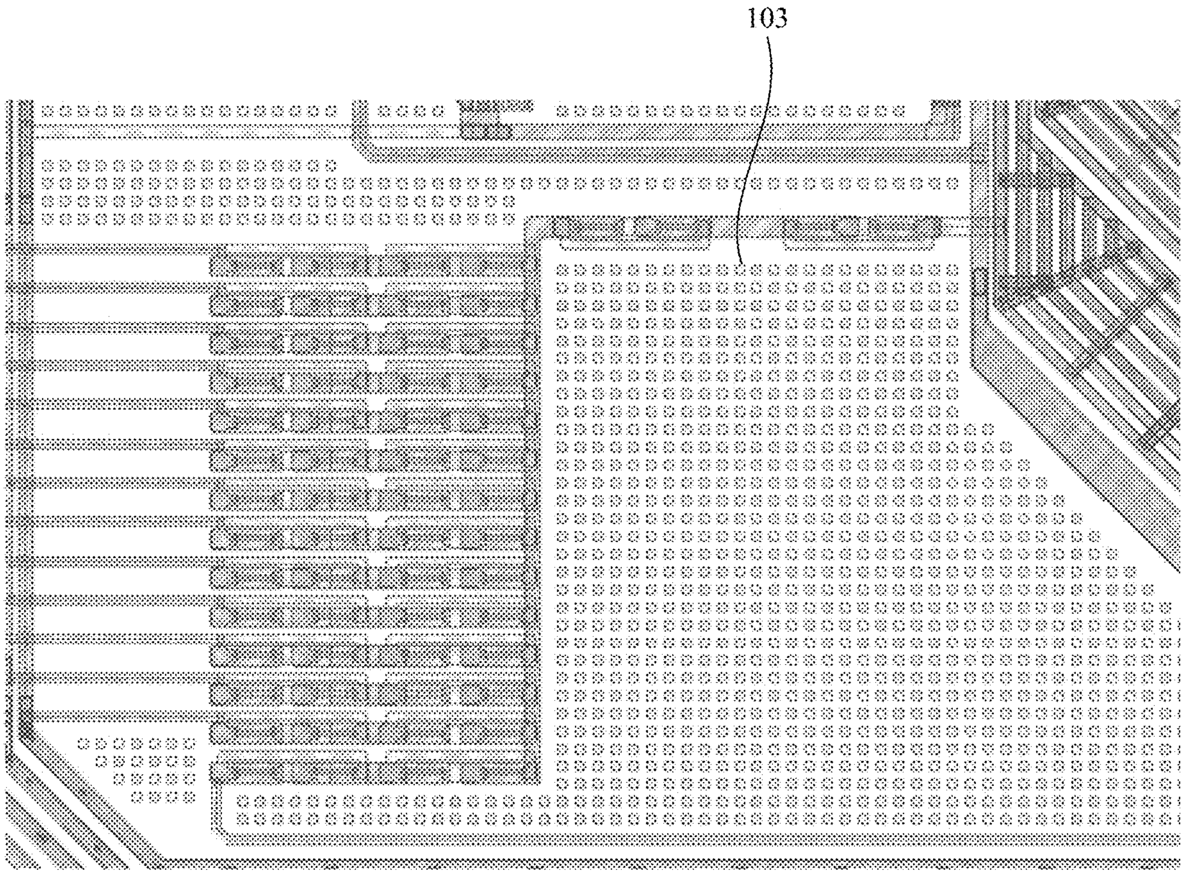
FIG. 8 is a partial schematic diagram of an array substrate in region B of FIG. 4 according to some embodiments of the present disclosure.

Referring to FIG. 3 and FIG. 4, the peripheral region 101*b* includes two GOA regions 101*b*1 extending along the first direction X, and the two GOA regions 101*b*1 are respectively located on two sides of the display region 101*a*. The plurality of first patterns 103 are disposed on two sides of each of the two GOA) regions 101*b*1. That is, the plurality of first patterns 103 include a plurality of first patterns 103 in a first region, a plurality of first patterns 103 in a second region, a plurality of first patterns 103 in a third region, and a plurality of first patterns 103 in a fourth region. For example, referring to FIG. 8, the plurality of first patterns 103 in the first region are arranged in an array in an upper-left region of the substrate 101. In addition, the plurality of first patterns 103 in the second region are arranged in an array in a bottom-left region of the substrate 101, the plurality of first patterns 103 in the third region are arranged in an array in an upper-right region of the substrate 101, and the plurality of first patterns 103 in the fourth region are arranged in an array in a lower-right region of the substrate 101.

Figure 9:
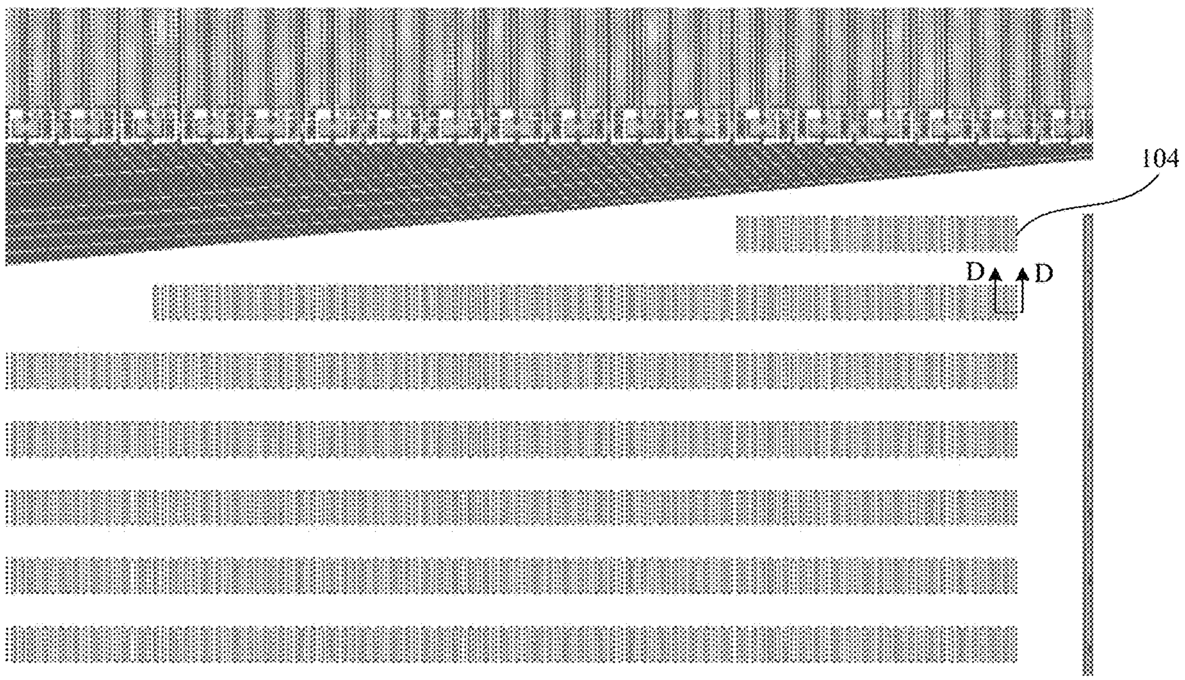
FIG. 9 is a partial schematic diagram of an array substrate in region C of FIG. 4 according to some embodiments of the present disclosure.

As can be seen from FIG. 4, the peripheral region 101*b* further includes a fan-out region 101*b*2 extending along the second direction Y. FIG. 9 is a partial schematic diagram of the array substrate shown in FIG. 4 in the region C according to some embodiments of the present disclosure. Referring to FIG. 4 and FIG. 9, the array substrate 10 further includes a plurality of second patterns 104. The plurality of second patterns 104 are at least disposed on one side of the fan-out region 101*b*2, the plurality of second patterns 104 are spaced apart from the fan-out region 101*b*2 along the second direction Y, and the plurality of second patterns 104 disposed on the same side of the fan-out region 101*b*2 are arranged in an array. The second pattern 104 is different from the first pattern 103 in at least one of the shape and size. In some embodiments, the shape of the orthographic projection of the second pattern 104 on the substrate 101 is a rectangle.

Figure 10:
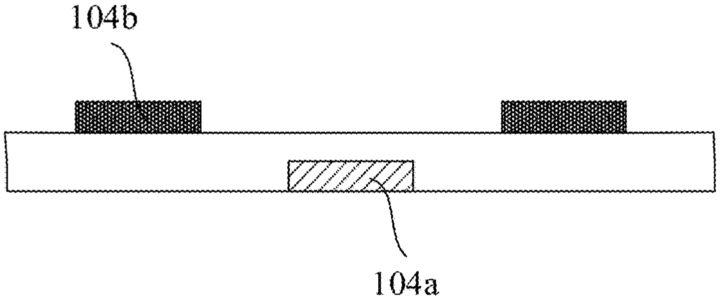
FIG. 10 is a schematic sectional diagram of FIG. 9 along a DD direction.
Figure 11:
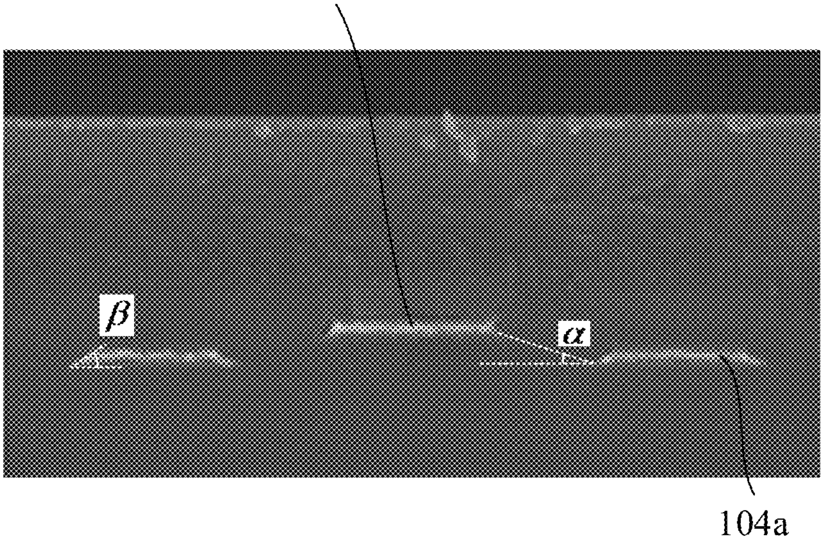
FIG. 11 is a sectional scanning electron microscope (SEM) image of FIG. 9 along the DD direction.

FIG. 10 is a sectional view of FIG. 9 along the DD direction. FIG. 11 is an electron microscope diagram of FIG. 9 along the DD direction. Referring to FIG. 10 and FIG. 11, the plurality of second patterns 104 includes a plurality of first type of second patterns 104*a* and a plurality of second type of second patterns 104*b*. The plurality of first type of second patterns 104*a* are disposed in the same layer as the gate 1021, and the plurality of second type of second patterns 104*b* are disposed in the same layer as the source 10241 and the drain 10242.

Here, the plurality of first type of second patterns 104*a* being disposed in the same layer as the gate 1021 refers to that the plurality of first type of second patterns 104*a* and the gate 1021 are made of the same material by the same patterning process. The plurality of second type of second patterns 104*b* being disposed in the same layer as the source 10241 and the drain 10242 refers to that the plurality of second type of second patterns 104*b* and the source 10241 and the drain 10242 are made of the same material by the same patterning process.

In the embodiments of the present disclosure, by providing the plurality of second patterns 104 in the fan-out region 101*b*2, the consumption amount of the etching solution can be reduced, thereby avoiding the residual material of the source/drain electrode film layer caused by less etching solution in the GOA region 101*b*1 and the display region 101*a*, and preventing the channel of the thin film transistor 102 from being conducted due to the residual material of the source/drain electrode film layer on the active layer 1023. In this way, the active layer 1023 of the thin film transistor 102 is prevented from being rendered conductive, thereby ensuring the characteristics of the thin film transistor 102, and improving the display effect and yield of the array substrate.

In addition, the fan-out region 101*b*2 of the array substrate 10 is generally provided with a plurality of signal lines. Part of the line segment of at least one of the plurality of signal lines is disposed in the same layer as the gate 1021, and the other part of the line segment is disposed in the same layer as the source 10241 and the drain 10242. In this way, the plurality of first type of second patterns 104*a* and the plurality of second type of second patterns 104*b* in the plurality of second patterns 104 are respectively disposed in the same layer as the gate 1021 and the source 10241 (or the drain 10242), which can ensure that the plurality of second patterns 104 and the patterns (signal lines) in the fan-out region 101*b*2 have relatively good uniformity, thereby improving the yield of the array substrate 10.

Referring to FIG. 10, the orthographic projections of the plurality of first type of second patterns 104*a* on the substrate 101 are not overlapped with the orthographic projections of the plurality of second type of second patterns 104*b* on the substrate 101, which can prevent the plurality of first type of second patterns 104*a* and the plurality of second type of second patterns 104*b* from influencing each other, thereby ensuring the yield of the array substrate 10.

In some embodiments, referring to FIG. 10, the orthographic projections of the plurality of first type of second patterns 104*a* on the substrate 101 and the orthographic projections of the plurality of second type of second patterns 104*b* on the substrate 101 are alternately arranged in the second direction Y.

In some embodiments, referring to FIG. 11, an angle α between a connection line between the first type of second pattern 104*a* and the second type of second pattern 104*b* closest to the first type of second pattern 104*a* and the bearing surface of the base substrate 101 ranges from 25 degrees to 60 degrees.

In addition, an angle β between the slope of the boundary of each second pattern 104 and the bearing surface of the base substrate 101 ranges from 25 degrees to 60 degrees.

Figure 12:
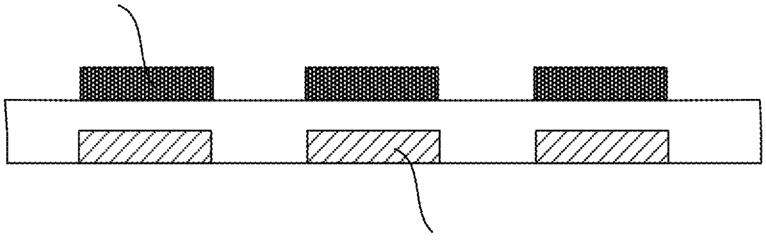
FIG. 12 is a schematic sectional diagram of a second pattern according to some embodiments of the present disclosure.

Alternatively, referring to FIG. 12, the number of the plurality of first type of second patterns 104*a* is equal to the number of the plurality of second type of second patterns 104*b*, and the plurality of first type of second patterns 104*a* are in one-to-one correspondence with the plurality of second type of second patterns 104*b*. The orthographic projection of each first type of second pattern 104*a* on the substrate 101 is overlapped with the orthographic projection of the corresponding second type of second pattern 104*b* on the substrate 101.

In the embodiments of the present disclosure, the shape of the orthographic projection of the second pattern 104 on the substrate 101 is a rectangle, and the length of the second pattern 104 in the first direction X is greater than the length of the second pattern 104 along the second direction Y. For example, the second pattern 104 is a strip-shaped structure extending along the first direction X.

In some embodiments, one of the two vertical boundaries of the second pattern 104 is parallel to the first direction X, and the other boundary is parallel to the second direction Y. The second direction Y is parallel to the arrangement direction of the display region 101*a* and the GOA region 101*b*1. That is, the plurality of second pattern 104 are arranged in an array in the first direction X and the second direction Y.

Figure 13:
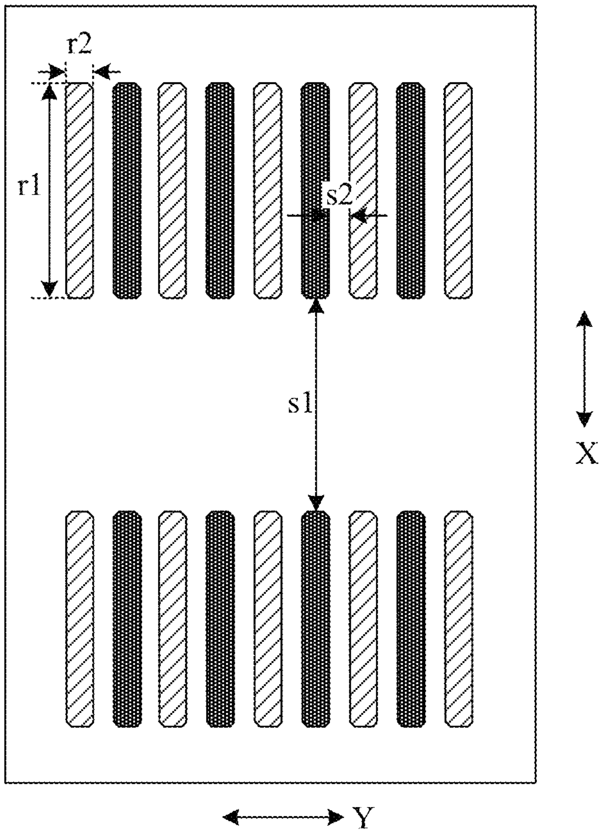
FIG. 13 is a top view of a second pattern according to some embodiments of the present disclosure.

In some embodiments, referring to FIG. 13, the length of the second pattern 104 along the first direction X is r1, the distance between any two adjacent second patterns 104 along the first direction X is s1, and r1/s1 ranges from 0.9 to 1.9. The length of the second pattern 104 along the second direction Y is r2, the distance between any two adjacent second patterns 102 along the second direction Y is s2, and r2/s2 ranges from 0.9 to 1.9.

In some embodiments, the length r1 of the second pattern 104 along the first direction X ranges from 50 μm to 100 μm, and the length r2 of the second pattern 104 along the second direction Y ranges from 2 μm to 10 μm. The length r1 of the second pattern 104 along the first direction X is not too big (the second pattern 104 is a short bar-shaped structure), which can prevent charges from collecting at the second pattern 104 due to an excessively long second pattern 104, thereby avoiding the risk of electrostatic discharge.

In addition, the distance s1 between any two adjacent second patterns 104 along the first direction X ranges from 50 μm to 100 μm, and the distance s2 between any two adjacent second patterns 104 along the second direction Y ranges from 3 μm to 10 μm.

Referring to FIG. 13, the shape of the orthographic projection of the second pattern 104 on the substrate 101 has four chamfers on the basis of the rectangle, that is, the shape of the orthographic projection of the second pattern 104 on the substrate 101 is a chamfered rectangle.

In some embodiments, the minimum distance between the orthographic projections of the plurality of second patterns 104 on the substrate 101 and the orthographic projections of other structures in the array substrate 10 on the substrate 101 ranges from 75 μm to 100 μm. That is, the distance between the plurality of second patterns 104 and other structures in the array substrate 10 is long, which can prevent the plurality of second patterns 104 from affecting other structures in the array substrate 10. The other structures are wires for transmitting signals in the array substrate 10, or thin film transistors.

In the embodiments of the present disclosure, the plurality of second patterns 104 are disposed on two sides of the fan-out region 101*b*2. For example, the plurality of second patterns 104 include a plurality of second patterns 104 disposed in a fifth region and a plurality of second patterns 104 disposed in a sixth region. The fifth region and the sixth region are respectively on two sides of the fan-out region 101*b*2.

In the embodiments of the present disclosure, the plurality of thin film transistors 102 disposed in the GOA region 101*b*1 constitute a plurality of cascaded shift register units. Each shift register unit includes eighteen thin film transistors 102 and one storage capacitor. Certainly, the shift register unit may be other structures, which is not limited in the embodiments of the present disclosure.

Figure 14:
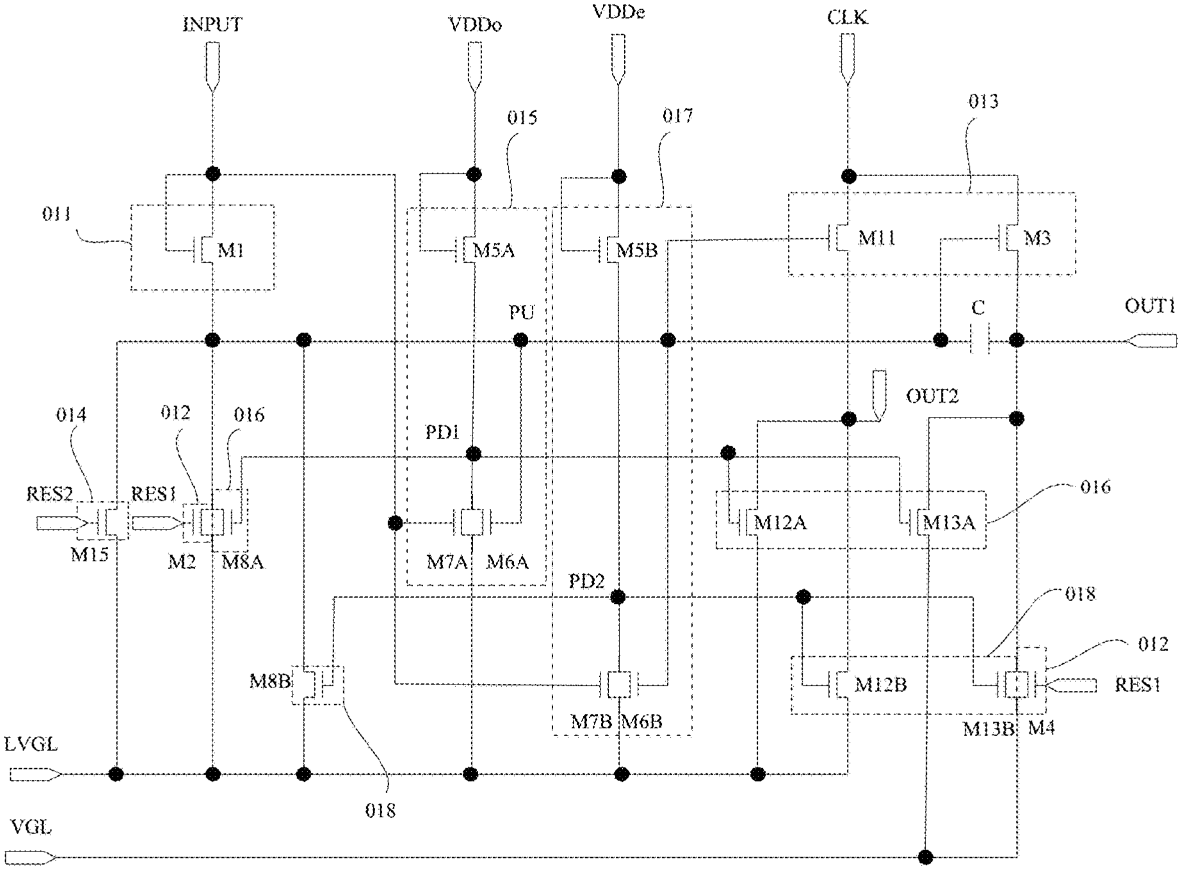
FIG. 14 is a circuit structural diagram of a shift register unit according to some embodiments of the present disclosure.

FIG. 14 is a circuit structural diagram of a shift register unit according to some embodiments of the present disclosure. As shown in FIG. 14, the shift register unit 01 includes an input circuit 011, a first reset circuit 012, an output circuit 013, a second reset circuit 014, a first pull control circuit 015, a first pull circuit 016, a second pull control circuit 017, a second pull circuit 018, and a storage capacitor C.

The input circuit 011 includes a first transistor M1. The gate and the first electrode of the first transistor M1 are connected to a signal input terminal INPUT, and the second electrode of the first transistor M1 is connected to a pull-up node PU.

The first reset circuit 012 includes a second transistor M2 and a third transistor M4. The gate of the second transistor M2 is connected to a first reset signal terminal RES1, the first electrode of the second transistor M2 is connected to the pull-up node PU, and the second electrode of the second transistor M2 is connected to a first fixed voltage terminal LVGL. The gate of the third transistor M4 is connected to the first reset signal terminal RES1, the first electrode of the third transistor M4 is connected to a first signal output terminal OUT1, and the second electrode of the third transistor M4 is connected to a second fixed voltage terminal VGL.

The output circuit 013 includes a first output transistor M3 and a second output transistor M11. The gate of the first output transistor M3 is connected to the pull-up node PU, the first electrode of the first output transistor M3 is connected to a clock signal terminal CLK, and the second electrode of the first output transistor M3 is connected to the first signal output terminal OUT1. The gate of the second output transistor M11 is connected to the pull-up node PU, the first electrode of the second output transistor M11 is connected to the clock signal terminal CLK, and the second electrode of the second output transistor M11 is connected to a second signal output terminal OUT2.

The second reset circuit 014 includes a fourth transistor M15. The gate of the fourth transistor M15 is connected to the second reset signal terminal RES2, the first electrode of the fourth transistor M15 is connected to the pull-up node PU, and the second electrode of the fourth transistor M15 is connected to the first fixed voltage terminal LVGL.

The first pull control circuit 015 includes a fifth transistor M5A, a sixth transistor M6A, and a seventh transistor M7A. The gate and the first electrode of the fifth transistor M5A are connected to a first control terminal VDDo, and the second electrode of the fifth transistor M5A is connected to a first pull-down node PD1. The gate of the sixth transistor M6A is connected to the pull-up node PU, the first electrode of the sixth transistor M6A is connected to the first pull-down node PD1, and the second electrode of the sixth transistor M6A is connected to the first fixed voltage terminal LVGL. The gate of the seventh transistor M7A is connected to the signal input terminal INPUT, the first electrode of the seventh transistor M7A is connected to the first pull-down node PD1, and the second electrode of the seventh transistor M7A is connected to the first fixed voltage terminal LVGL.

The first pull circuit 016 includes an eighth transistor M8A, a ninth transistor M12A, and a tenth transistor M13A. The gate of the eighth transistor M8A is connected to the first pull-down node PD1, the first electrode of the eighth transistor M8A is connected to the pull-up node PU, and the second electrode of the eighth transistor M8A is connected to the first fixed voltage terminal LVGL. The gate of the ninth transistor M12A is connected to the first pull-down node PD1, the first electrode of the ninth transistor M12A is connected to the second signal output terminal OUT2, and the second electrode of the ninth transistor M12A is connected to the first fixed voltage terminal LVGL. The gate of the tenth transistor M13A is connected to the first pull-down node PD1, the first electrode of the tenth transistor M13A is connected to the first signal output terminal OUT1, and the second electrode of the tenth transistor M13A is connected to the second fixed voltage terminal VGL.

The second pull control circuit 017 includes an eleventh transistor M5B, a twelfth transistor M6B, and a thirteenth transistor M7B. The gate and the first electrode of the eleventh transistor M5B are connected to a second control terminal VDDe, and the second electrode of the eleventh transistor M5B is connected to the second pull-down node PD2. The gate of the twelfth transistor M6B is connected to the pull-up node PU, the first electrode of the twelfth transistor M6B is connected to the second pull-down node PD2, and the second electrode of the twelfth transistor M6B is connected to the first fixed voltage terminal LVGL. The gate of the thirteenth transistor M7B is connected to the signal input terminal INPUT, the first electrode of the thirteenth transistor M7B is connected to the second pull-down node PD2, and the second electrode of the thirteenth transistor M7B is connected to the first fixed voltage terminal LVGL.

The second pull circuit 018 includes a fourteenth transistor M8B, a fifteenth transistor M12B, and a sixteenth transistor M13B. The gate of the fourteenth transistor M8B is connected to the second pull-down node PD2, the first electrode of the fourteenth transistor M8B is connected to the pull-up node PU, and the second electrode of the fourteenth transistor M8B is connected to the first fixed voltage terminal LVGL. The gate of the fifteenth transistor M12B is connected to the second pull-down node PD2, the first electrode of the fifteenth transistor M12B is connected to the second signal output terminal OUT2, and the second electrode of the fifteenth transistor M12B is connected to the first fixed voltage terminal LVGL. The gate of the sixteenth transistor M13B is connected to the second pull-down node PD2, the first electrode of the sixteenth transistor M13B is connected to the first signal output terminal OUT1, and the second electrode of the sixteenth transistor M13B is connected to the second fixed voltage terminal VGL.

A first electrode of the storage capacitor C is connected to the pull-up node PU, and a second electrode of the storage capacitor C is connected to the first signal output terminal OUT1.

One of the first electrode and the second electrode of each transistor is a source, and the other one is a drain.

In the embodiments of the present disclosure, the thickness of the source/drain electrode layer 1024 is 350 nm (nanometers), and the thickness of the gate 1021 is 345 nm. Certainly, the source/drain electrode layer 1024 and the gate 1021 may also have other thicknesses, which is not limited in the embodiments of the present disclosure.

In summary, the embodiments of the present disclosure provide an array substrate. A plurality of first patterns are provided on one side of the GOA region of the array substrate, which ensures that there is enough etching solution for etching to form the GOA region and the source and the drain of the thin film transistor in the display region, thereby avoiding the residual material of the source/drain electrode film layer caused by less etching solution in the GOA region and the display region, and preventing the channel of the thin film transistor from being conducted due to the residual material of the source/drain electrode film layer on the active layer. In this way, the active layer of the thin film transistor is prevented from being rendered conductive, thereby ensuring the characteristics of the thin film transistor, and improving the yield of the array substrate and the display effect of the display panel.

Figure 15:
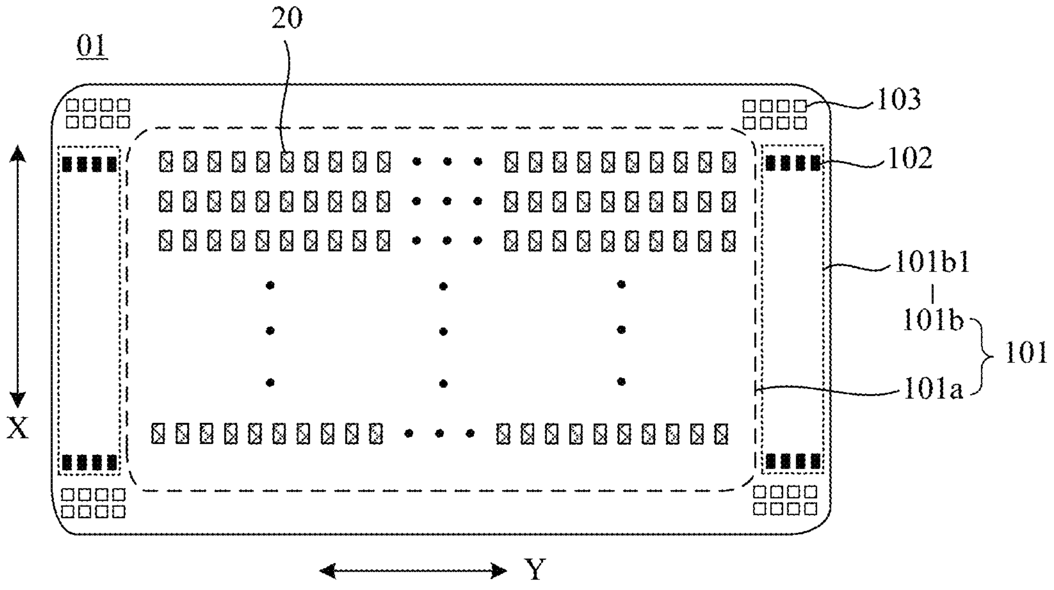
FIG. 15 is a schematic structural diagram of a display panel according to some embodiments of the present disclosure.

FIG. 15 is a schematic structural diagram of a display panel according to some embodiment of the present disclosure. As can be seen from FIG. 15, the display panel 01 includes a plurality of light-emitting units 20 and the array substrate 10 provided in the above embodiments. The plurality of light-emitting units 20 are disposed in the display region 101*a* of the array substrate 10. The light-emitting units 20 shown in FIG. 15 are only used to indicate that the light-emitting units 20 are disposed in the display region 101*a,* and are not used to represent an actual shape of the light-emitting units 20.

Figure 16:
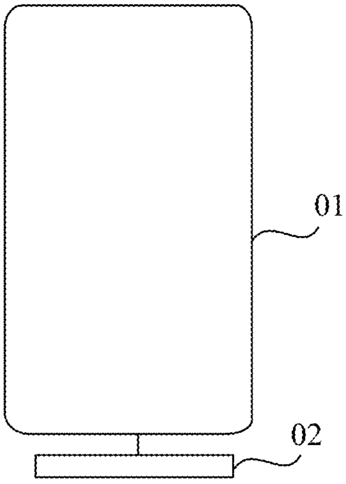
FIG. 16 is a schematic structural diagram of a display device according to some embodiments of the present disclosure.

FIG. 16 is a schematic structural diagram of a display device according to some embodiment of the present disclosure. Referring to FIG. 16, the display device may include a power supply assembly 02 and the display panel 01 provided in the above embodiments. The power supply assembly 02 is configured to supply power to the display panel 01.

In some embodiments, the display device is any product or component having a display function such as a liquid crystal display (LCD), an organic light-emitting diode (OLED) display device, an electronic paper, a low temperature poly-silicon (LTPS) display device, a low temperature poly-silicon oxide (LTPO) display device, a mobile phone, a tablet computer, a television, a display, a notebook computer, a digital photo frame, a navigator, or the like.

The transistors in all embodiments of the present disclosure are thin film transistors, and the transistors used in the embodiments of the present disclosure are mainly switching transistors according to their functions in the circuit. Since the source and the drain of the switching transistor are symmetrical, the source and the drain are interchangeable. In the embodiments of the present disclosure, the source is referred to as the first electrode, and the drain is referred to as the second electrode. According to the form in the drawings, it's specified that the intermediate terminal of the transistor is the gate, the signal input terminal is the source, and the signal output terminal is the drain. In addition, the switching transistor used in the embodiments of the present disclosure includes either an N-type switching transistor or a P-type switching transistor. The N-type switching transistor is turned on when the gate is at a high level and turned off when the gate is at a low level. The P-type switching transistor is turned on when the gate is at a low level and turned off when the gate is at a high level.

It is understood that, although various elements, components, regions, layers, and/or portions are described by using the terms first, second, etc., these elements, components, regions, layers and/or portions should not be limited by these terms. These terms are only used to distinguish one element, component, region, layer or portion from another element, component, layer or portion. Thus, the first element, the first component, the first region, the first layer or the first portion discussed above can also referred to as the second element, the second component, the second region, the second layer or the second portion without departing from the teachings of the present disclosure.

In the present disclosure, spatially relative terms, such as "row," "column," "under," "on," "left," "right," are used to describe the relationship between one element or feature and another element or feature as illustrated in the drawings. It is understood that these spatially relative terms are intended to encompass different orientations of the device in use or operation in addition to the orientation depicted in the drawings. For example, if a device in the drawings is turned over, the element described as being "under" other elements or features would be "on" the other elements or features. Thus, the exemplary term "under" encompasses both "on" and "under". The device may be oriented in other ways (rotated 90 degrees or at other orientations) and the spatially relative descriptors used herein are interpreted accordingly. In addition, it is understood that when a layer is referred to as being "between two layers", the layer may be the only layer between the two layers, or one or more intermediate layers may also be present.

The terminology is only used for the purpose of describing particular embodiments and is not intended to limit the present disclosure. As used herein, the singular forms "a/an," "one," and "the" are intended to include the plural forms as well, unless the context clearly indicates otherwise. It is further understood that the terms "comprise" and/or "include" used in the present disclosure is used to indicate the presence of the stated feature, entirety, step, operation, element, and/or component, without excluding the presence or addition of one or more other features, entireties, steps, operations, elements, components, and/or groups. As used herein, the term "and/or" includes any and all combinations of one or more of the associated listed items. Specific features, structures, materials, or characteristics described in this specification can be combined in any one or more embodiments or examples in a suitable manner. Furthermore, under the condition of no contradiction, various embodiments or examples described in this specification and the features in different embodiments or examples may be combined.

Unless otherwise defined, all terms (including technical and scientific terms) used herein have the same meaning as commonly understood by one of ordinary skill in the art to which the present disclosure belongs. It is further understood that terms such as those defined in commonly used dictionaries should be interpreted as having the meaning that is consistent with the meaning in the relevant art and/or the context of this specification, and should not be interpreted in an idealized or overly formal sense, unless expressly so defined herein.

The descriptions above are merely optional embodiments of the present disclosure, and are not intended to limit the present disclosure. Any modifications, equivalent substitutions, improvements, and the like made within the spirit and principles of the present disclosure shall be included within the protection scope of the present disclosure.

What is claimed is:

1. An array substrate, comprising:

a substrate, comprising a display region and a peripheral region surrounding the display region, the peripheral region at least comprising a gate-driver-on-array (GOA) region extending in a first direction;

a plurality of thin film transistors, the plurality of thin film transistors being disposed at least in the GOA region; and a plurality of first patterns, wherein the plurality of first patterns are disposed at least on one side of the GOA region, the plurality of first patterns are spaced apart from the GOA region in the first direction, and a plurality of first patterns disposed on a same side of the GOA region are arranged in an array; wherein the thin film transistor comprises a gate, a gate insulating layer, an active layer and a source/drain electrode layer which are sequentially laminated in a direction going away from the substrate, wherein the source/drain electrode layer comprises a source and a drain spaced apart from each other; and the plurality of first patterns are disposed in a same layer as at least one of the source and the drain; and the peripheral region further comprises a fan-out region extending along a second direction, the second direction being parallel to an arrangement direction of the GOA region and the display region; and the array substrate further comprises:

a plurality of second patterns, wherein the plurality of second patterns are disposed at least on one side of the fan-out region, the plurality of second patterns are spaced apart from the fan-out region along the second direction, a plurality of second patterns disposed on a same side of the fan-out region are arranged in an array, and the second pattern is different from the first pattern in at least one of the shape and size:

wherein the plurality of second patterns comprise a plurality of first type of second patterns and a plurality of second type of second patterns, wherein the plurality of first type of second patterns are disposed in a same layer as the gate, and the plurality of second type of second patterns are disposed in a same layer as the source and the drain.

2. The array substrate according to claim 1, wherein a shape of an orthographic projection of the first pattern on the substrate is a rectangle.

3. The array substrate according to claim 2, wherein the shape of the orthographic projection of the first pattern on the substrate is a square.

4. The array substrate according to claim 3, wherein one of two vertical boundaries of the first pattern is parallel to the first direction, and the other one of the two boundaries is parallel to a second direction; wherein the second direction is parallel to an arrangement direction of the display region and the GOA region, and the first direction intersects the second direction.

5. The array substrate according to claim 4, wherein a length of the first pattern along the first direction is m1, and a distance between any two adjacent first patterns along the first direction is n1, wherein m1/n1 ranges from 0.9 to 1.9; and a length of the first pattern along the second direction is m2, and a distance between any two adjacent first patterns along the second direction is n2, wherein m2/n2 ranges from 0.9 to 1.9.

6. The array substrate according to claim 1, wherein a minimum distance between orthographic projections of the plurality of first patterns on the substrate and orthographic projections of other structures in the array substrate on the substrate ranges from 15 μm to 30 μm.

7. The array substrate according to claim 1, wherein the peripheral region comprises two GOA regions extending along the first direction, and the two GOA regions are respectively located on two sides of the display region;

wherein the plurality of first patterns are disposed on two sides of each of the two GOA regions.

8. The array substrate according to claim 1, wherein orthographic projections of the plurality of first type of second patterns on the substrate are not overlapped with orthographic projections of the plurality of second type of second patterns on the substrate.

9. The array substrate according to claim 8, wherein the orthographic projections of the plurality of first type of second patterns on the substrate and the orthographic projections of the plurality of second type of second patterns on the substrate are alternately arranged along the second direction.

10. The array substrate according to claim 1, wherein a number of the plurality of first type of second patterns is equal to a number of the plurality of second type of second patterns, and the plurality of first type of second patterns are in one-to-one correspondence with the plurality of second type of second patterns; and an orthographic projection of each of the first type of second patterns on the substrate is overlapped with an orthographic projection of one corresponding second type of second pattern on the substrate.

11. The array substrate according to claim 1, wherein a shape of an orthographic projection of the second pattern on the substrate is rectangular, and a length of the second pattern along the first direction is greater than a length of the second pattern along the second direction.

12. The array substrate according to claim 11, wherein one of two vertical boundaries of the second pattern is parallel to the first direction, and the other one of the two vertical boundary is parallel to the second direction.

13. The array substrate according to claim 12, wherein the length of the second pattern along the first direction is r1, and a distance between any two adjacent second patterns along the first direction is s1, wherein r1/s1 ranges from 0.9 to 1.9; and the length of the second pattern along the second direction is r2, and a distance between any two adjacent second patterns along the second direction is s2, wherein r2/s2 ranges from 0.9 to 1.9.

14. The array substrate according to claim 1, wherein a minimum distance between orthographic projections of the second patterns on the substrate and orthographic projections of other structures in the array substrate on the substrate ranges from 75 μm to 100 μm.

15. The array substrate according to claim 1, wherein the plurality of second patterns are disposed on two sides of the fan-out region.

16. The array substrate according to claim 1, wherein the plurality of thin film transistors disposed in the GOA region constitute a plurality of cascaded shift register units, wherein each of the shift register units comprises eighteen thin film transistors and one storage capacitor.

17. The array substrate according to claim 1, wherein an active layer of the thin film transistor made of a metal oxide material.

18. A display panel, comprising a plurality of light-emitting units and an array substrate; wherein the array substrate includes:

a substrate, comprising a display region and a peripheral region surrounding the display region, the peripheral region at least comprising a gate-driver-on-array (GOA) region extending in a first direction;

a plurality of thin film transistors, the plurality of thin film transistors being disposed at least in the GOA region; and a plurality of first patterns, wherein the plurality of first patterns are disposed at least on one side of the GOA region, the plurality of first patterns are spaced apart from the GOA region in the first direction, and a plurality of first patterns disposed on a same side of the GOA region are arranged in an array; wherein the thin film transistor comprises a gate, a gate insulating layer, an active layer and a source/drain electrode layer which are sequentially laminated in a direction going away from the substrate, wherein the source/drain electrode layer comprises a source and a drain spaced apart from each other; and the plurality of first patterns are disposed in a same layer as at least one of the source and the drain; and the peripheral region further comprises a fan-out region extending along a second direction, the second direction being parallel to an arrangement direction of the GOA region and the display region; and the array substrate further comprises:

a plurality of second patterns, wherein the plurality of second patterns are disposed at least on one side of the fan-out region, the plurality of second patterns are spaced apart from the fan-out region along the second direction, a plurality of second patterns disposed on a same side of the fan-out region are arranged in an array, and the second pattern is different from the first pattern in at least one of the shape and size;

wherein the plurality of second patterns comprise a plurality of first type of second patterns and a plurality of second type of second patterns, wherein the plurality of first type of second patterns are disposed in a same layer as the gate, and the plurality of second type of second patterns are disposed in a same layer as the source and the drain; and the plurality of light-emitting units are disposed in the display region of the array substrate.

19. The display panel according to claim 18, wherein a shape of an orthographic projection of the first pattern on the substrate is a rectangle.

* * * * *